(12) United States Patent
Flynn

(10) Patent No.: US 8,732,499 B2
(45) Date of Patent: May 20, 2014

(54) STATE RETENTION CIRCUIT ADAPTED TO ALLOW ITS STATE INTEGRITY TO BE VERIFIED

(75) Inventor: David Walter Flynn, Cambridge (GB)

(73) Assignee: ARM Limited, Cambridge (GB)

( * ) Notice: Subject to any disclaimer, the term of this patent is extended or adjusted under 35 U.S.C. 154(b) by 391 days.

(21) Appl. No.: 13/067,395

(22) Filed: May 27, 2011

(65) Prior Publication Data

US 2012/0303985 A1    Nov. 29, 2012

(51) Int. Cl.
    *G06F 1/32*    (2006.01)
(52) U.S. Cl.
    USPC ........... 713/323; 713/321; 713/322; 713/324; 714/21; 714/30
(58) Field of Classification Search
    USPC ................. 713/321–324; 714/21, 30
    See application file for complete search history.

(56) References Cited

U.S. PATENT DOCUMENTS

| | | | |
|---|---|---|---|
| 5,377,200 A | 12/1994 | Pedneau | |
| 5,774,473 A * | 6/1998 | Harley | 714/30 |
| 6,378,108 B1 | 4/2002 | Schoellkopf | |
| 6,870,412 B2 | 3/2005 | Cho | |
| 6,989,702 B2 * | 1/2006 | Ko et al. | 327/203 |
| 7,154,317 B2 * | 12/2006 | Flynn et al. | 327/202 |
| 7,171,605 B2 | 1/2007 | White | |
| 7,269,780 B2 | 9/2007 | Arima et al. | |
| 7,310,755 B2 | 12/2007 | Mudge et al. | |
| 7,332,949 B2 | 2/2008 | Kim | |
| 7,565,597 B1 * | 7/2009 | Branth et al. | 714/763 |
| 7,827,427 B2 | 11/2010 | Lee et al. | |
| 7,941,683 B2 | 5/2011 | Branover et al. | |
| 8,042,022 B2 | 10/2011 | Ito et al. | |
| 2004/0153762 A1 | 8/2004 | Flynn et al. | |
| 2004/0250186 A1 | 12/2004 | Takasaki | |
| 2009/0261871 A1 | 10/2009 | Lu | |
| 2009/0326854 A1 | 12/2009 | Chakravadhanula et al. | |

OTHER PUBLICATIONS

SOCcentral, "Designing for State Retention", *Online*—printed Nov. 2011, 4 pages.
Kim et al., "Experimental Measurement of a Novel Power Gating Structure with Intermediate Power Saving Mode", *ISPLED '04*, Aug. 2004, pp. 20-25.

(Continued)

*Primary Examiner* — Thuan Du
(74) *Attorney, Agent, or Firm* — Nixon & Vanderhye P.C.

(57) ABSTRACT

A state retention component is provided which is configured to form part of data processing circuitry. The state retention component is configured to hold a state value at a node of the data processing circuitry when the data processing circuitry enters a low power mode. The state retention component comprises a scan input, wherein the state retention component configured, when a scan enable signal is asserted, to read in the state value from a scan input value applied at the scan input, and a scan output, wherein the state retention component is configured, when the scan enable signal is asserted, to read out the state value to the scan output. When the scan enable signal is not asserted, the state retention circuit outputs at the scan output a parity value, wherein the parity value is generated by combinatorial function circuitry on the basis of the state value and the scan input value, wherein the combinatorial function circuitry is configured such that the parity value inverts if either the state value or the scan input value changes, thus providing an external indication of the integrity of the state value held by the state retention component.

17 Claims, 11 Drawing Sheets

(56) References Cited

OTHER PUBLICATIONS

Henzler et al., "Dynamic State-Retention Flip-Flop for Fine-Grained Power Gating with Small Design and Power Overhead", *IEEE Journal of Solid-State Circuits*, vol. 41, No. 7, Jul. 2006, pp. 1654-1661.

Austin et al., "Low Power Robust Computing—Tutorial", 2004, 67 pages.

ARM DevCon Panel Discussion, "Shaken or Stirred by Low Power Design Challenges?", *ARM Synopsys*, 2007, 63 pages.

Chung et al., "On-Demand Solution to Minimize I-Cache Leakage Energy with Maintaining Performance", *IEEE Transactions on Computers*; vol. 57, No. 1, Jan. 2008, pp. 7-24.

Idgunji, "Case Study of a Low Power MTCMOS based ARM926 SoC: Design, Analysis and Test Challenges", *International Test Conference*, Lecture 2.3, 2007, pp. 1-10.

Calhoun et al., "Standby Power Reduction Using Dynamic Voltage Scaling and Canary Flip-Flop Structures", *IEEE Journal of Solid-State Circuits*, vol. 39, No. 9, Sep. 2004, pp. 1504-1511.

Goering, "Low Power Design"—Special Technology Report, *SCD Source*, Sep. 2008, Issue 1, pp. 1-17.

Office Action mailed May 8, 2012 in co-pending U.S. Appl. No. 12/385,674.

UK Search Report dated Jul. 20, 2012 for GB 1205295.7.

U.S. Appl. No. 13/067,396, filed May 27, 2011, Idgunji et al.

U.S. Appl. No. 12/385,674, filed Apr. 15, 2009, Flynn.

Office Action mailed Sep. 14, 2012 in co-pending U.S. Appl. No. 13/067,396.

Office Action mailed Apr. 11, 2013 in co-pending U.S. Appl. No. 13/067,396.

\* cited by examiner

STATE RETENTION CIRCUIT ADAPTED TO ALLOW ITS STATE INTEGRITY TO BE VERIFIED

BACKGROUND OF THE INVENTION

1. Field of the Invention

The present invention relates to the field of data processing systems. More particularly, this invention relates to state retention components in data processing systems which are configured to hold respective state values when the data processing system enters a low power mode and wherein a scan path connects together the state retention components such that these state values may be scanned in and scanned out.

2. Description of the Prior Art

It is known to provide data processing systems which contain a number of state retention components configured to hold respective state values at respective nodes of the data processing system when the data processing system enters a low power mode. This enables the data processing system to later exit the low power mode and to continue its data processing operations from the configuration in which it entered that low power mode. For example, these state retention components may be provided by so-called "balloon latches", which can be provided with their own supply voltage and configured to have characteristics desirable in lowering the data processing system's power consumption during the low power mode (e.g. low current leakage).

It is also known that such state retention components can be connected together in series such that a scan path is formed. Such a scan path (or "scan chain") enables shift-register operation in which test pattern state can be loaded into and unloaded from the state retention components to allow automatic test pattern generated (ATPG) production test vectors to be used to test the logic circuits of the data processing apparatus connected to the state retention components.

As process geometries for forming integrated circuits become increasingly small, these circuits (and in particular in the present context the state retention components) become increasingly vulnerable to soft errors, which may have a number of causes such as ionising radiation, thermal variation, device aging and so on. Of course, if such errors occur in the state retention components, then the respective state values held by those state retention components cannot be relied upon, meaning that the data processing circuitry cannot be guaranteed to continue its data processing operation as desired when it exits the low power mode. One approach to providing resistance to such soft errors is to ensure that a safe margin is provided in the voltage supplied to the state retention components over their minimum operating voltage in order to increase their resistance to such soft errors. However, given the desire to push the power consumption of such data processing systems ever lower, the additional power consumed within this safe margin is undesirable. Another approach to supporting the integrity of the state retention components has been the provision of voltage-sensitive "canary circuits" provided in association with each of the state retention components, in which a deliberately skewed shadow state retention structure is configured to fail before the actual state retention circuit. However, the additional circuit area and power taken up by such canary circuits is undesirable.

Accordingly, it would be desirable to provide an improved technique for supporting the state integrity of such state retention components.

By way of background information, the following documents discuss related aspects of the prior art:

1) "Designing for State Retention", D. Flynn and A. Gibbons, Dec. 12, 2008, available from http://www.soccentral.com/results.asp?EntryID=27642;

2) "Dynamic State-Retention Flip-Flop for Fine-Grained Power Gating With Small Design and Power Overhead", Stephan Henzler et al., IEEE JOURNAL OF SOLID-STATE CIRCUITS, VOL. 41, NO. 7, JULY 2006;

3) "Shaken or Stirred by Low Power Design Challenges?", presented at ARM DevCon 2007, available from: http://www.synopsys.com/Solutions/EndSolutions/EclvpseSolutions/CapsuleModule/arm-snps_devcon_pane107.pdf;

4) "Case Study of a Low Power MTCMOS based ARM926 SoC", Sachin Idgunji, Design, Analysis and Test Challenges, Lecture 2.3, International Test Conference 2007;

5) "Low Power Design", Richard Goering, SCD source, September 2008, Issue 1, available from: http://www.leepr.com/PDF/SCDsource_STR_LowPower.pdf;

6) "Experimental Measurement of Novel Power Gating Structure with Intermediate Power Saving Mode", Kim, Kosonocky et al., ISPLED '04, Aug. 9-11, 2004, Newport Beach, Calif., USA;

7) "Low Power Robust Computing Tutorial", EECS, University of Michigan 2005, available at http://www.eecs.umich.edu/~taustin/papers/MICRO2005-tutorial.pdf;

8) "On-Demand Solution to Minimize I-Cache Leakage Energy with Maintaining Performance", S. W. Chung and K. Skadron, IEEE Transactions on Computers, 57(1):7-24, January 2008, available at: http://www.cs.virginia.edu/~skadron/Papers/icache_leakage_tc08.pdf, 9) "Standby Power Reduction Using Dynamic Voltage Scaling and Canary Flip-Flop Structures", Benton H. Calhoun and Anantha P. Chandrakasan, IEEE JOURNAL OF SOLID-STATE CIRCUITS, VOL. 39, NO. 9, SEPTEMBER 2004; and 10) U.S. patent application Ser. No. 12/385,674.

SUMMARY OF THE INVENTION

Viewed from a first aspect, the present invention provides a state retention component configured to form part of data processing circuitry, said state retention component configured to hold a state value at a node of said data processing circuitry when said data processing circuitry enters a low power mode, said state retention component comprising: a scan input, said state retention component configured, when a scan enable signal is asserted, to read in said state value from a scan input value applied at said scan input; and a scan output, said state retention component configured, when said scan enable signal is asserted, to read out said state value to said scan output, wherein said state retention component is configured, when said scan enable signal is not asserted, to output at said scan output a parity value, wherein said parity value is generated by combinatorial function circuitry on the basis of said state value and said scan input value, said combinatorial function circuitry configured such that said parity value inverts if either said state value or said scan input value changes.

The inventor of the present invention realised that where a state retention component is configured to hold an item of state value and is provided with a scan input and a scan output, the scan output could be reused to provide information about the state value being held by that state retention component. In particular it was realised that, where the state retention component is configured to act as a component in a scan chain when a scan enable signal is asserted, use could be made of the scan output when that scan enable signal is not asserted, a parity value being provided at the scan output which will invert if either the state value or the scan input value changes.

The advantage of this configuration is most clearly seen in the context of a series of state retention components coupled together to form a scan chain, in which the scan output of one state retention component is coupled to the scan input of the next state retention component. In such a configuration, where the scan inputs and outputs are coupled together for the purpose of providing a scan chain, much of this scan chain functionality can be reused for propagation of information related to the state values being held. Furthermore, since the parity value generated by each state retention component (in the combinatorial function circuitry provided for this purpose) depends on both the state value held by that state retention component and the value provided at its scan input value, the concatenation of the state retention components (as is already done to provide the scan chain) enables a linking of the parity values generated by the state retention components in a fashion which means that the parity value generated at the conclusion of the chain will reflect the parity of all state values held by all state retention components in that chain. Accordingly, when the data processing circuitry is in its low power mode and the state retention components should be holding their respective state values, when one state value within the chain changes, the parity value observed at the conclusion of the chain will invert, signalling that this "first failure" within the chain of state retention components has occurred.

The state retention component may take a number of forms. For example, these may be as simple as register devices which are clock gated in order to maintain their values when the data processing system enters the low power mode, or they may be some other form of state retention device which is explicitly configured to have a mode of operation corresponding to the low power mode in which a state value within the state retention circuit is held. In one embodiment said state retention components comprise a plurality of scan flops. Scan flops represent state retention components which are adapted for concatenation into a scan path and thus represent a particularly suitable basis for application of the present technique. Furthermore, it is common for contemporary EDA (electronic design automation) tools to offer standard support for scan-ready synthesis, wherein scan flops are mapped onto standard D-type registers allowing for the scan-connection cost function.

The combinatorial function circuitry may take a number of forms, but in one embodiment said combinatorial function circuitry is provided by XOR circuitry. In another embodiment said combinatorial function circuitry is provided by XNOR circuitry. In general, many different particular arrangements of the combinatorial function circuitry are possible, which would provide the required functionality that the parity value being provided at the scan output which will invert if either the state value or the scan input value changes.

The combinatorial function circuitry within the state component can be configured to generate the parity value in a number of ways. In particular, in one embodiment said combinatorial function circuitry is configured to generate said parity value with odd parity with respect to said state value and said scan input value. In another embodiment, said combinatorial function circuitry is configured to generate said parity value with even parity with respect to said state value and said scan input value.

The data processing circuitry can enter a low power mode in a number of ways. In one embodiment low power mode is a halt mode. For example, a halt mode may be effected by suspending the clock input. In another embodiment said low power mode is a reduced voltage mode. For example, the data processing circuitry may be configured to operate in an active mode in which "full" voltage is applied to components of the data processing circuitry, but to enter a low power mode in which data processing operations are suspended in which a reduced voltage is applied to the components of the data processing circuitry. Typically this reduced voltage will be arranged such that a sufficient voltage is applied to retain state values where required within state retention components, but at a level which is too low to allow normal data processing operations.

In one embodiment said state retention component is provided with a retention voltage supply, said retention voltage supply being configured to provide a sufficient voltage to hold said state value at said node of said data processing circuitry when said data processing circuitry enters said low power mode, wherein said combinatorial function circuitry is powered by said retention voltage supply. Accordingly, by powering the combinatorial function circuitry from the same voltage supply which enables the respective state values to be held during the low power mode, the generation of the parity information is supported when the data processing circuitry enters the low power mode. It is to be noted that for power saving reasons, the voltage supply provided to the combinatorial function circuitry can itself be reduced to a "drowsy retention" mode wherein its operation is also at near-threshold. Although this may result in longer propagation times, the parity output may nonetheless be generated and therefore the integrity of the held state values can be monitored.

The combinatorial function circuitry is particularly provided to enable the parity value generated by the state retention component to be monitored when the data processing circuitry is in its low power mode. Accordingly, it may be concluded that the parity value is of little interest when the data processing circuitry is not in its low power mode. In particular it is to be noted that the parity value will typically be in a constant state of fluctuation when the data processing circuitry is performing its normal data processing operations, and it may be decided that the operation of the combinatorial function circuitry simply wastes power. Accordingly, in one embodiment said combinatorial function circuitry is provided with a combinatorial function circuitry voltage supply which is configured to be reduced when said data processing circuitry is not in said low power mode. Alternatively, in one embodiment said combinatorial function circuitry is configured to be power-gated off when said data processing circuitry is not in said low power mode.

In order to trigger the state retention component to enter a state retention mode corresponding to the low power mode, the state retention component may be provided with a retention signal and in one embodiment said state retention component is configured to be responsive to a retention signal to enter a state retention mode, and said combinatorial function circuitry is configured to be enabled in response to said retention signal.

In one such embodiment, the retention signal may additionally be used to enable and disable the combinatorial function circuitry, and in one embodiment said state retention component is configured to be responsive to de-assertion of said retention signal to exit said state retention mode, and said combinatorial function circuitry is configured to be disabled in response to de-assertion of said retention signal.

In addition to the scan input and scan output, the state retention component may be further provided with a parity input and a parity output. In particular, this parity input and parity output can enable the state retention components in a data processing apparatus to be coupled together in a different way to the coupling together of the state retention components via the scan inputs and outputs. For example, whilst the scan chains may run in one direction through the data processing apparatus, the parity inputs and outputs can be coupled together to provide a parity chain in a direction orthogonal to the scan chains. It should be understood that "orthogonal" here refers to the fact that the information from this further parity chain is complementary to the information on the scan path, and is not a geometric limitation. Accordingly, in one embodiment the state retention component further comprises a parity input and a parity output, wherein said state retention component is configured, when said scan enable signal is not asserted, to output at said parity output a further parity value, wherein said further parity value is generated by further combinatorial function circuitry on the basis of said state value and a value at said parity input, said further combinatorial function circuitry configured such that said further parity value inverts if either said state value or said value at said parity input changes. Given that the output parity value taken from a scan path formed from the concatenation of multiple state retention components can only indicate that a state value has changed somewhere along its length, arranging a further parity path (or more typically multiple parity paths) which crossed the scan path can help to identify where the state value changed. Indeed, where the state retention components are arranged to be coupled to two sets of paths (scan paths running in one "direction" and parity paths running an another "direction") which are fully complementary to one another, the two sets of output parity values can effectively provide a coordinate system by which the state retention component responsible for the state value which has changed can be identified.

Viewed from a second aspect, the present invention provides a state retention component configured to form part of data processing circuitry, said state retention component configured to hold a state value at a node of said data processing circuitry when said data processing circuitry enters a low power mode, said state retention component comprising: scan input means for reading in, when a scan enable signal is asserted, said state value from a scan input value applied to said scan input means; scan output means for reading out, when said scan enable signal is asserted, said state value, wherein said state retention component is configured, when said scan enable signal is not asserted, to output at said scan output means a parity value; and combinatorial function means for generating said parity value on the basis of said state value and said scan input value, said combinatorial function means configured such that said parity value inverts if either said state value or said scan input value changes.

Viewed from a third aspect the present invention provides a method of configuring a state retention component to form part of data processing circuitry, said state retention component configured to hold a state value at a node of said data processing circuitry when said data processing circuitry enters a low power mode, said method comprising the steps of: providing a scan input for said state retention component and configuring said state retention component, when a scan enable signal is asserted, to read in said state value from a scan input value applied at said scan input; and providing a scan output for said state retention component and configuring said state retention component, when said scan enable signal is asserted, to read out said state value to said scan output; and configuring said state retention component, when said scan enable signal is not asserted, to output at said scan output a parity value, wherein said parity value is generated by a combinatorial function on the basis of said state value and said scan input value, said combinatorial function configured such that said parity value inverts if either said state value or said scan input value changes.

Viewed from a fourth aspect, the present invention provides a computer program product storing in a non-transient fashion a computer program, which when executed on a computing device causes the computing device to generate a representation of the apparatus according to the first aspect.

Viewed from a fifth aspect the present invention provides a computer program product storing in a non-transient fashion a computer program, which when executed on a computing device causes the computing device to carry out the method according to the third aspect.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 1:
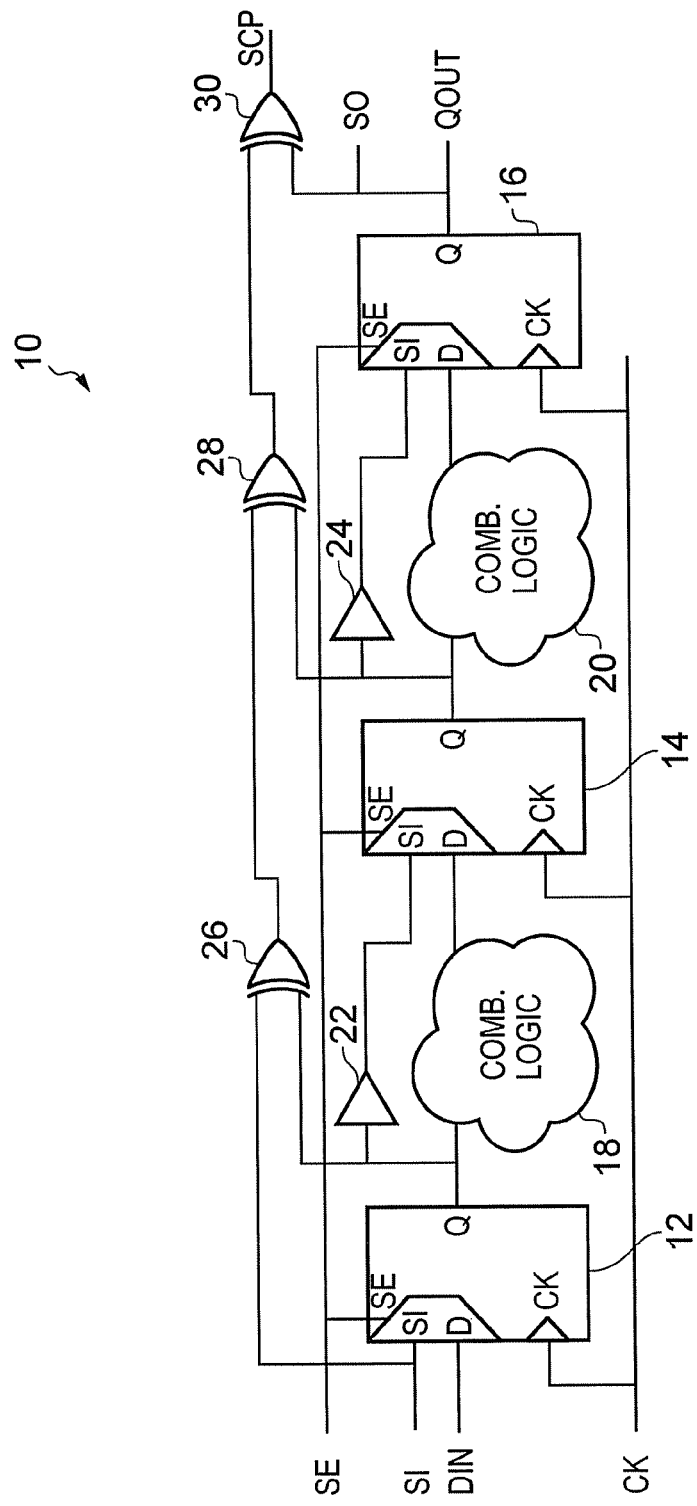
FIG. 1 schematically illustrates a set of state retention circuits in one embodiment, having a separate scan path and parity path.

FIG. 1 schematically illustrates a data processing apparatus in one embodiment. The data processing apparatus 10 comprises three state retention circuits 12, 14, 16 which are embodied in this example by standard scan-flops. The scan-flops are connected to combinatorial logic circuitry 18, 20 to form a scan chain such that in scan mode (when the scan enable signal SE is asserted) test pattern state can be loaded and unloaded so that automatic test pattern generated (ATPG) production test vectors can be used to test the functional combinatorial logic circuitry between the scan-flops. Thus, the scan path is formed by the scan path segments connecting the output Q of one scan-flop to the scan input SI of the next scan-flop. It should be noted that the combinatorial logic circuitry 18, 20 will typically comprise many inputs and outputs, but for clarity of illustration and in order to focus on the single scan chain shown, only a single input and output to each instance of the combinatorial logic circuitry is shown.

Not only do the scan flops 12, 14, 16 enable state values to be scanned in and scanned out, but they also enable state values to be held at the respective nodes of the data processing circuitry where they are positioned, when the data processing circuitry enters a low power mode. In other words in this context a "node" is the point where each scan-flop is located with respect to the combinatorial logic circuitry. As will be discussed in more detail in the following, each state retention circuit can hold a state value internally which can be provided at the output Q, either during the normal clocked operation of the data processing circuitry, when operational data values enter each state retention circuit via its D input and are output at its Q output, or during a scan mode when state values can be read into the state retention circuit via its scan-in input SI and scanned out via the output Q. Accordingly, the state retention circuits enable particular state values to be held at particular nodes of the data processing circuitry in a low power mode, such that when the data processing circuitry exits the low power mode, these values are presented at the respective inputs to the combinatorial logic circuitry. Further, the state retention circuits, being coupled together on a scan path, enable these state values to be scanned in via a shift-register operation. The scan path segments between the state retention circuits additionally comprise hold-time fixing buffers 22, 24 which have been deemed necessary during the design process of this data processing apparatus, in order to ensure that the values passed along the scan path are valid for a sufficiently long period of time to enable the value to be correctly scanned in to the subsequent state retention circuit's SI input.

The data processing apparatus 10 further comprises parity information generation elements 26, 28, 30, which in this example are embodied by XOR gates. The inputs to each XOR gate are coupled to the output Q of each state retention circuit and the output of the previous XOR gate. The first XOR gate in the sequence 26 is coupled to the SI input of the first state retention circuit 12 instead of a previous XOR gate output. Accordingly, the sequence of XOR gates 26, 28, 30 represent "even" parity generators coupled together to form a parity path which finally generates an output parity value SCP which reflects the parity of all the register state in the scan chain. It should be noted that it is not necessary for every state retention circuit in a scan chain to be connected to the parity path and the output parity value SCP could represent the parity of only a subset of the scan chain.

In terms of the automated design process for such an integrated circuit, the addition of these parity information generation elements is straightforward in that these XOR gates can simply be stitched into the net list once the scan chain ordering has been established. It should be noted however that in order not to disrupt the circuit layout late in the design flow it may be considered advantageous initially to place a scan-flop and an XOR gate adjacent to one another. Even if some of the XOR gates are not intended to be connected into the parity path, this strategy may nonetheless be beneficial to avoid design flow disruption. If the XOR gates are placed in association with each scan-flop then the hook up of these components can easily follow the scan chain order which results from the physically aware test scan chain stitching.

Accordingly, the parity path provides an output parity value SCP which reflects the parity of all the register state in the connected state retention circuits in a manner that minimises wiring impact on the remainder of the circuitry. The parity path can be allowed to be a relatively slow propagation path (not being a critical path) in order to minimise power consumption. Hence, the SCP value can be monitored when the data processing system is in a low power mode in which the state retention circuits should hold their respective state values, and if the SCP value toggles (i.e. inverts) this signals in real-time that the first state retention circuit in the chain has failed to hold its state value. Various responses are possible when the SCP value toggles, as will be discussed in more detail in the following, but in terms of the linear scan and parity chains illustrated in FIG. 1, given that the toggling SCP value only indicates that one of the state retention circuits in the chain has failed to hold its respective state value (but it is not known which) a typical response might be to use the scan chain mechanism in order to replace the set of values held along this scan chain by a predetermined set which have been stored elsewhere for such an eventuality.

Figure 2:
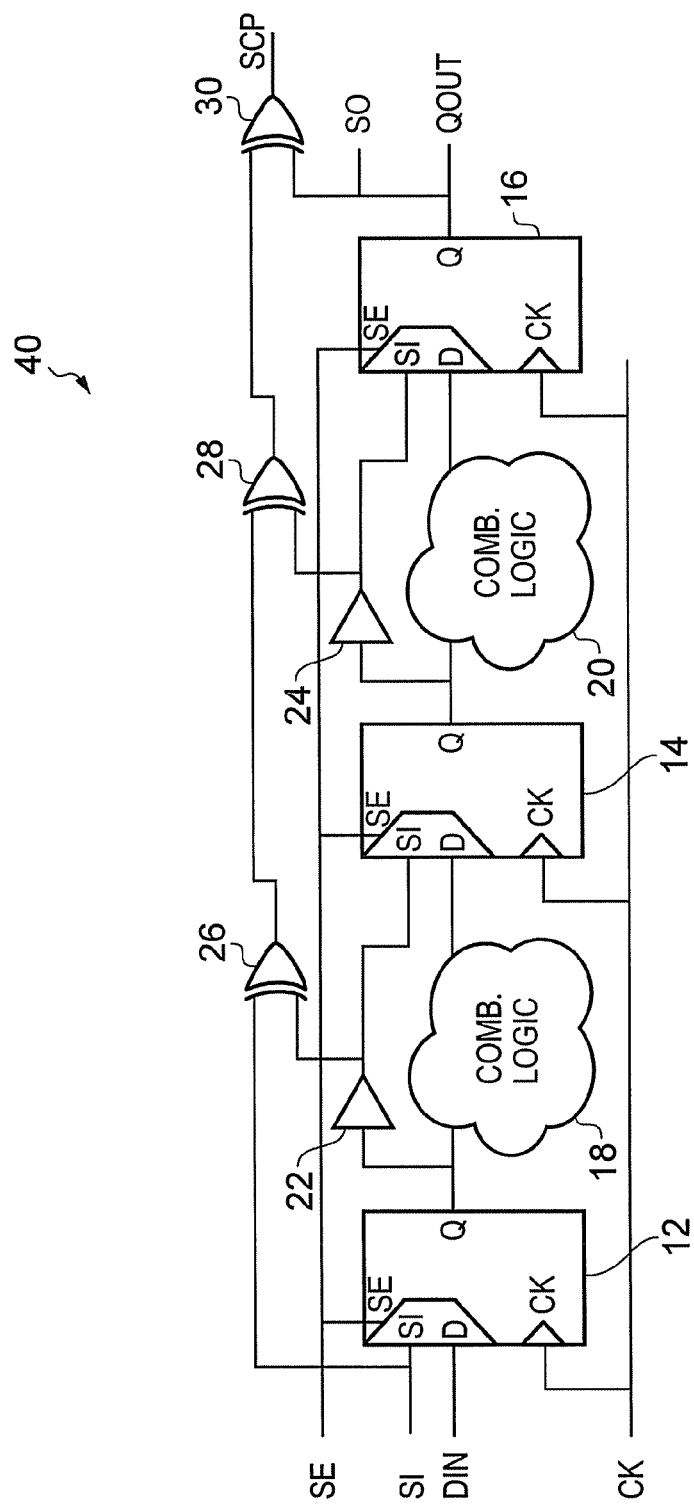
FIG. 2 schematically illustrates a set of state retention circuits in another embodiment, having a separate scan path and parity path.

FIG. 2 schematically illustrates a data processing apparatus 40 which comprises the same components as the data processing apparatus 10 illustrated in FIG. 1. These components operate in the same manner as those illustrated in FIG. 1 and are not described further here. The difference between the data processing apparatus 40 in FIG. 2 and the data processing apparatus 10 in FIG. 1 is that the parity information generation elements (XOR gates) 26, 28 are coupled to the scan chain segment between the state retention circuits (scan-flops) after the hold time fixing buffers 22, 24. This may be considered as beneficial over the arrangement shown in FIG. 1, since the extra loading from the parity information generation elements forming the parity path is not directly coupled to the functional output of the state retention circuits and thus a negative impact on the critical path (Q to D via the combinatorial logic) timing is avoided.

Figure 3:
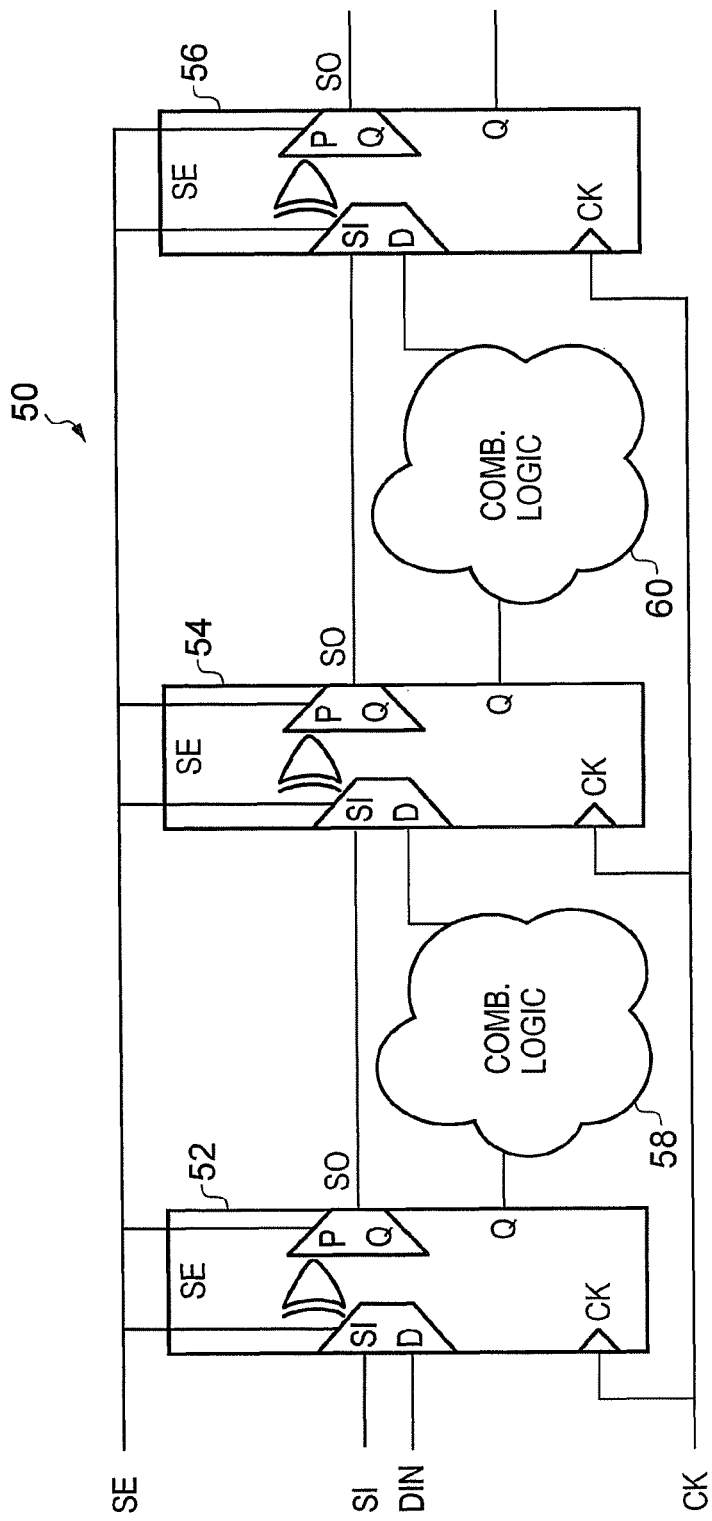
FIG. 3A schematically illustrates a set of state retention circuits in one embodiment in which the parity path shares the scan path.
FIG. 3B shows the logical configuration of the inputs and outputs of the state retention circuits illustrated in FIG. 3A.

FIG. 3A schematically illustrates a data processing apparatus 50 in one embodiment. Here, each state retention circuit 52, 54, 56 has both a data output Q and an explicit scan output SO. These scan outputs are typically provided with weak buffering to improve the hold time when the only load is the single SI input to the next state retention circuit plus the capacitance of the connecting wire. The data processing apparatus 50 in FIG. 3A also comprises combinatorial logic circuitry 58, 60.

The state retention circuits 52, 54, 56, which in this example are embodied by scan-flops, are configured such that the state value they hold (Q) is output from the SO output when the scan enable signal SE is asserted (i.e. in scan-shift mode), and the logical XOR of SI and Q when SE is deasserted. The logical configuration of the scan-flops shown in FIG. 3A is set out in the table given in FIG. 3B, the right-hand column of FIG. 3B also showing the equivalent Verilog behavioural model. It should be noted that the logical configuration set out in FIG. 3B represents even parity, but odd parity could also be implemented, for example if this reduces the transistor count.

Accordingly, the scan path between the scan-flops 52, 54, 56 is reused when not in scan-shift mode to provide the parity path for the data processing apparatus and ultimately the output parity value, which can be observed to monitor the state integrity of the values held in scan-flops 52, 54, 56. A particular advantage of this approach in terms of the design flow is that the provision of the parity path is transparent to the EDA tools, since the state retention circuits, once placed, are hooked up in exactly the same way as scan flops which do not provide this parity value producing behaviour.

Figure 4:
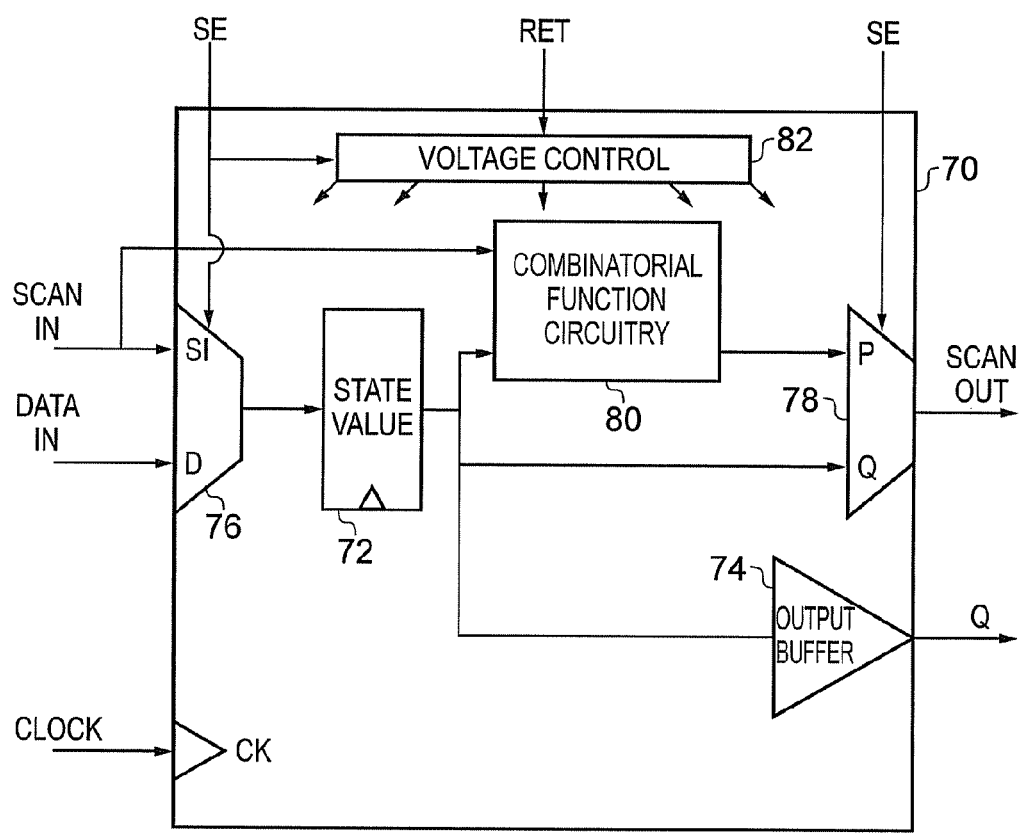
FIG. 4 schematically illustrates in more detail the configuration of one of the state retention circuits of FIG. 3A.

FIG. 4 schematically illustrates in more detail the internal configuration of one of the state retention circuits 52, 54, 56 shown in FIG. 3A. Here, the state retention circuit 70 comprises an internal register 72 which is configured to hold a state value. During normal operation of the system, data received via the data input port D is clocked into the register 72 before being output via output buffer 74 on output Q. Alternatively, in scan-mode, a state value is input via scan input SI, being clocked into register 72 before being output via the scan output SO. The scan enable signal SE steers the input multiplexer 76 and output multiplexer 78 accordingly. When the scan enable signal SE is not asserted, the combinatorial function circuitry 80 provides the parity value P which is output on the scan-out port SO. The combinatorial function circuitry 80 generates the parity value P in dependence on the state value held in register 72 and the value at the scan-in port SI. As discussed above, the combinatorial function circuitry 80 could be an XOR gate, an XNOR gate or any other logical function which provides the parity value P such that P inverts when either the state value held in register 72 or the scan input value inverts.

The state retention circuit 70 further comprises voltage control 82 which determines the voltage supply provided to the other components of the state retention circuit, in dependence on the current value of the scan enable signal SE and also in dependence on a retention signal RET, provided to indicate when the state retention circuit should enter a data retention mode corresponding to the remainder of the data processing circuitry entering a low power mode. Accordingly, when the RET signal is asserted, the voltage control 82 causes output buffer 74 to be switched off to save power since in the low power mode the data processing circuitry does not make use of the data path. By contrast, the state value register 72, the input multiplexer 76, the output multiplexer 78 and the combinatorial function circuitry 80 remain active, in order to enable the above described parity value generation to be carried out. It is to be noted that these components could nonetheless be provided with a relatively low supply voltage in this mode in order to support the overall low power mode of the data processing circuitry, providing a near-threshold supply voltage such that the parity value generation and propagation is maintained, albeit with relatively slow propagation times.

Conversely, the voltage control 82 is configured to reduce the voltage supplied to the combinatorial function circuitry 80 when the data processing circuitry is not in its low power mode (indicated by the deassertion of the RET signal) and the scan enable signal SE is not asserted (i.e. in normal data processing mode) since the changing data values passing through the state retention circuit would result in a continually changing parity value being generated in each instance of the combinatorial function circuitry, which is typically of limited value and merely consumes additional power. Accordingly, the voltage control 80 can reduce or even entirely switch off the voltage supply to the combinatorial function circuitry in this situation. The voltage control 82 may also be configured to deactivate the combinatorial function circuitry 80 when the state retention circuit is in scan mode (i.e. when SE is asserted) since the parity value P will not be used (the value Q being selected instead by the multiplexer 78). However, given that the scan mode is typically used during manufacturing testing of such integrated circuits, when power consumption is generally viewed as of lesser importance, this particular functionality may be viewed as unnecessary and dispensed with.

Thus far, the parity paths provided have only been discussed in terms of a linear arrangement of state retention circuits. It should be recognised that generally a number of parallel scan chains are implemented on a block of data processing circuitry wherein the length of the scan chains is traded off against the number of scan-in and scan-out connected chains that are implemented, typically sharing a common single scan enable control. EDA tools support the balancing of the length of the multiple chains and also providing clock gating to each cell in the implementation such that the scan clock is fully controllable to all flops in the scan chains. Hence, parity paths can be implemented for each scan chain in the data processing circuitry and the multiple output parity values can be monitored such that the first change of any state value in any chain can be used to flag the first state integrity error anywhere in the data processing circuitry.

Figure 5:
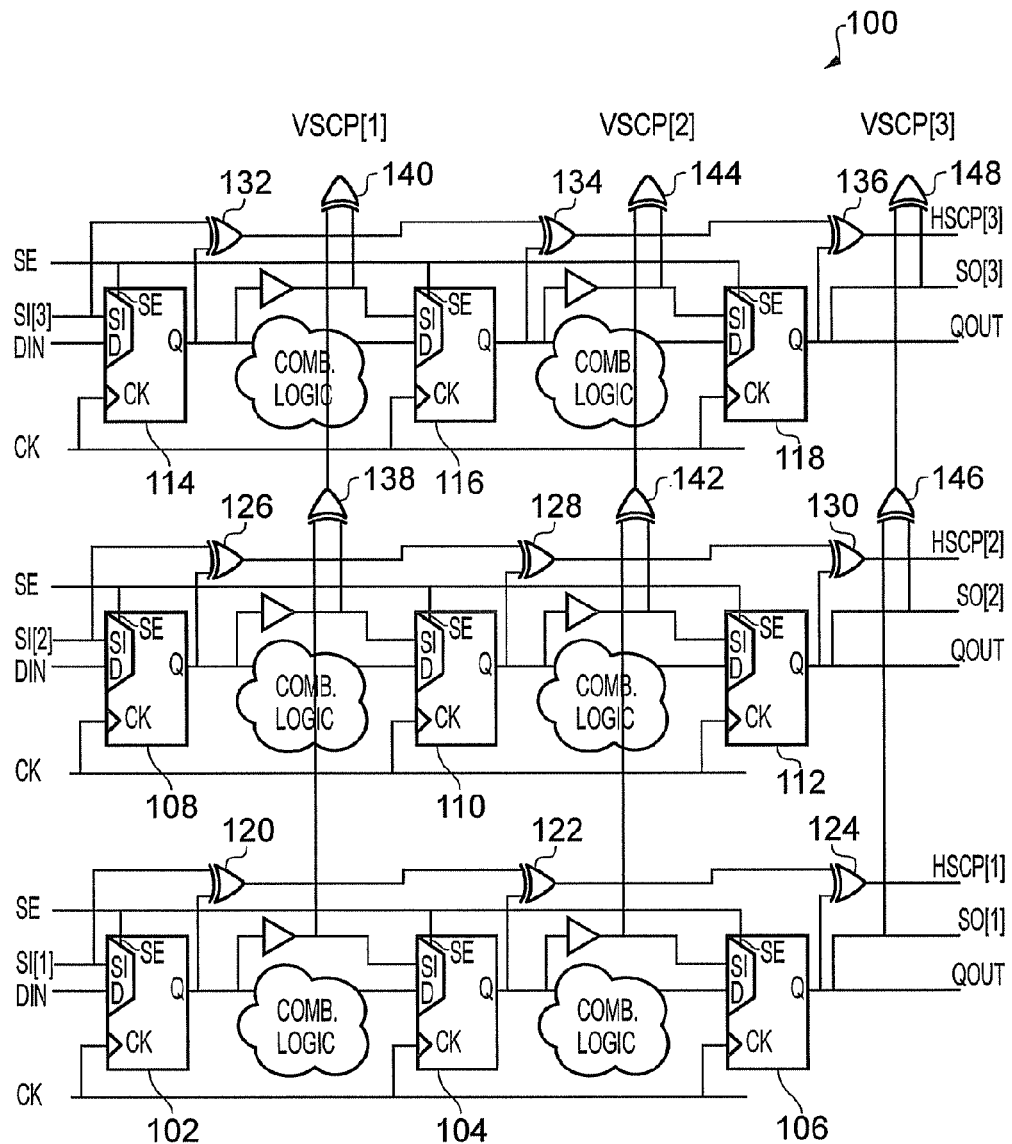
FIG. 5 schematically illustrates a data processing apparatus in one embodiment having two sets of parity paths.

FIG. 5 schematically illustrates a more complex embodiment in which not only are multiple parity paths provided, but a first set of these parity paths runs horizontally through the data processing circuitry, whilst the second set of these parity paths runs vertically through the data processing circuitry. It should be noted that the orthogonal, horizontal and vertical arrangement of the parity paths illustrated is for clarity of illustration only and it will be understood that functionally there is no need for such orthogonality between the various paths. Indeed in a typical integrated circuit layout the particular routes taken by the scan paths will be determined by automated tools and in consequence may not follow such strictly linear, perpendicular and parallel paths. In the data processing apparatus 100 shown in FIG. 5, the state retention circuits are arranged in groups of three to provide each output parity value. State retention circuits 102, 104, 106 contribute to "horizontal" output parity value HSCP[1], state retention circuits 108, 110, 112 contribute to HSCP [2] and state retention circuit 114, 116, 118 contribute to HSCP[3]. Meanwhile, state retention circuits 102, 108, 114 contribute to "vertical" output parity value VSCP[1], state retention circuits 104, 110, 116 contribute to VSCP[2] and state retention circuits 106, 112, 118 contribute to VSCP[3].

Accordingly, comparing FIG. 5 to FIG. 1, it can be seen that the parity path provided in the linear example of FIG. 1 provides one of the "horizontal" parity paths in FIG. 5, whilst the "vertical" parity paths in FIG. 5 are provided by the addition of the further XOR gates 138, 140, 142, 144, 146, 148. Hence, XOR gates 138, 140 form the first "vertical" parity path generating output parity value VSCP[1], XOR gates 142, 144 form the second vertical parity path generating output parity value VSCP[2] and XOR gates 146, 148 form the third vertical parity path providing output parity value VSCP[3].

In terms of the EDA flow, the vertical parity chains can be simply added as an additional step in the scan-stitching EDA tools flow, stitching-in these additional XOR gates on top of the already-determined scan chain ordering.

Providing both horizontal and vertical parity paths in the data processing circuitry in this manner means that the first failing state retention circuit (scan-flop) will therefore cause the state of both a horizontal parity path output value and a vertical parity path output value to toggle, allowing the identification of exactly which state retention circuit has failed. The ability to identify the specific failing state retention circuit is useful in diagnostics, since it can be determined whether the location of the first failing state retention circuit has a systematic component, for example the worst mismatched slave latch transistor structure losing state as the voltage is aggressively reduced, or whether the location of the first failing state retention circuit is more randomly distributed, for example due to substrate noise injection or crosstalk. Further, the ability to identify the specific state retention circuit in which the first failure has occurred also potentially allows that failing value to be corrected. For example, if the state retention circuit 110 in FIG. 5 were to fail first, this would cause HSCP[2] and VSCP[2] to toggle. Monitoring circuitry configured to observe the parity output values can then cause the value held by state retention circuit 110 to be corrected. In one example, this can happen by the set of state values from the second scan chain (SI[2] to SO[2]) to be read out, and for the value corresponding to state retention circuit 110 to be inverted (or otherwise corrected to its original value) before the set of state values scanned back into this scan chain. Although the monitoring circuitry may be configured to trigger reparative action as soon as a first failure occurs, the monitoring circuitry may further be configured to detect if more than one state retention circuit has failed (causing multiple HSCP and VSCP values to toggle), in which case the failing state retention circuit cannot be identified and in response a more thorough system reset can be carried out, for example resetting all state retention circuits or loading a predefined "reboot" set of state values.

Figure 6:
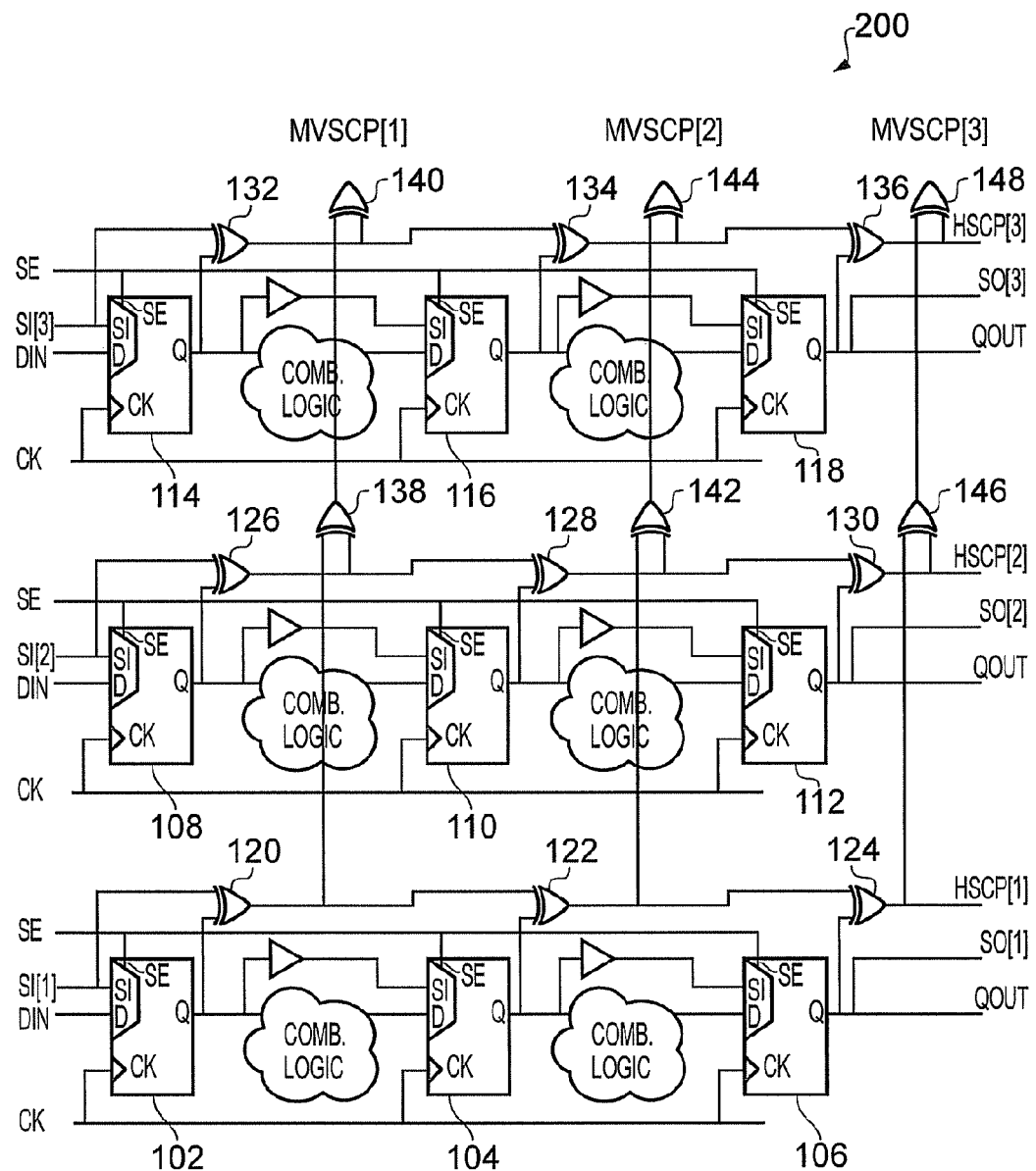
FIG. 6 schematically illustrates a data processing apparatus in another embodiment having two sets of parity paths.

FIG. 6 schematically illustrates an alternative configuration of a data processing system having both horizontal and vertical parity paths. The configuration of the circuitry in FIG. 6 is the same as that in FIG. 5, except that the XOR gates providing the parity information for the vertical parity paths (i.e. XOR gates 138, 140, 142, 144, 146) take their inputs from the output of the XOR gates on the horizontal parity paths. This configuration may for example be implemented in instances where a dedicated scan-out port is provided on the state retention circuits (e.g. scan-flops), since these scan-out ports can be cascaded vertically as well as chained horizontally. In essence, this configuration provides the same functionality in that monitoring of the output parity values HSCP[1-3] and MVSCP[1-3] can provide an indication of the first failing state retention circuit. It is however to be noted that the interconnection of the horizontal and vertical parity paths in this manner results in a ripple-effect in the MVSCP parity output values. For example, if the state value held by the state retention circuit 102 changes, this will not only cause HSCP[1] and MVSCP[1] to toggle, but it will also cause the output values MVSCP[2] and MVSCP[3] to toggle since each of these takes an input from the HSCP[1] parity chain further downstream.

Figure 7:
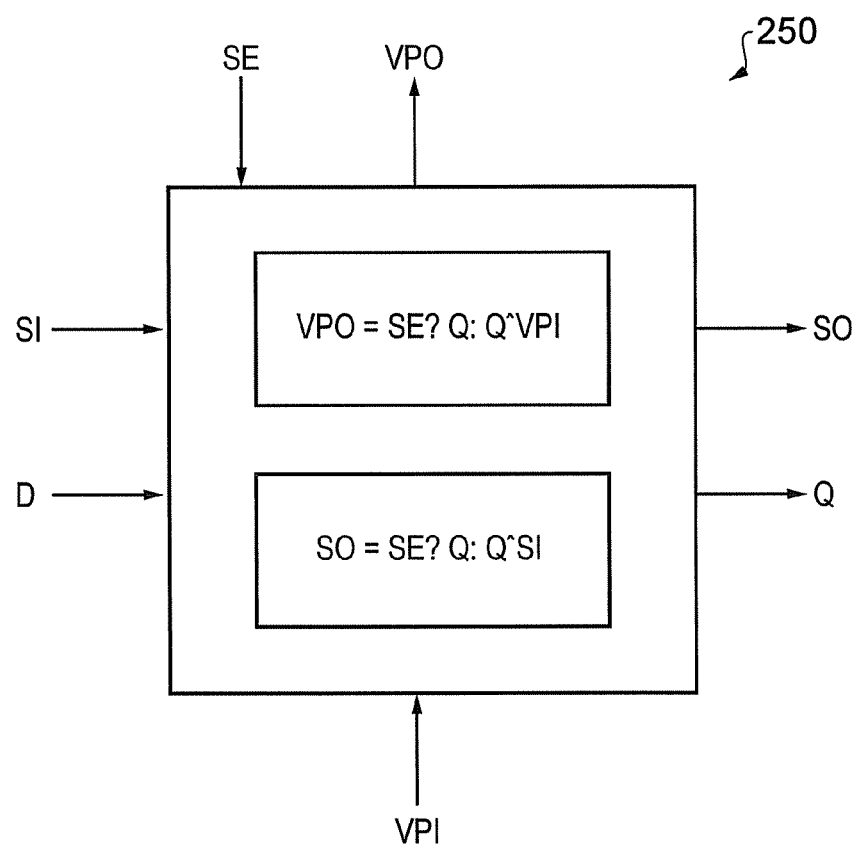
FIG. 7 schematically illustrates the logical configuration of a state retention circuit such as those illustrated in FIG. 6.

FIG. 7 schematically illustrates the configuration of a state retention circuit in one embodiment, which is configured to be connected to both horizontal and vertical parity paths. Here the state retention circuit is provided with a vertical parity input VPI and a vertical parity output VPO corresponding to the respective state retention circuit's input and output connections to the "vertical parity paths" discussed above with reference to FIGS. 5 and 6. The state retention circuit 250 is illustrated in terms of its Verilog behavioural model configuration in which the "vertical" parity output is defined as VPO=SE ? Q:Q^VPI and the scan-out port is configured as SE ? Q:Q^SI.

The configuration of the parity information generation elements in the examples illustrated thus far have been limited to the use of XOR gates. However, the present technique is in no way limited to the use of XOR gates and it will be understood that equivalent functionality can be achieved using other logical blocks such as XNOR gates and so on.

Figure 8:
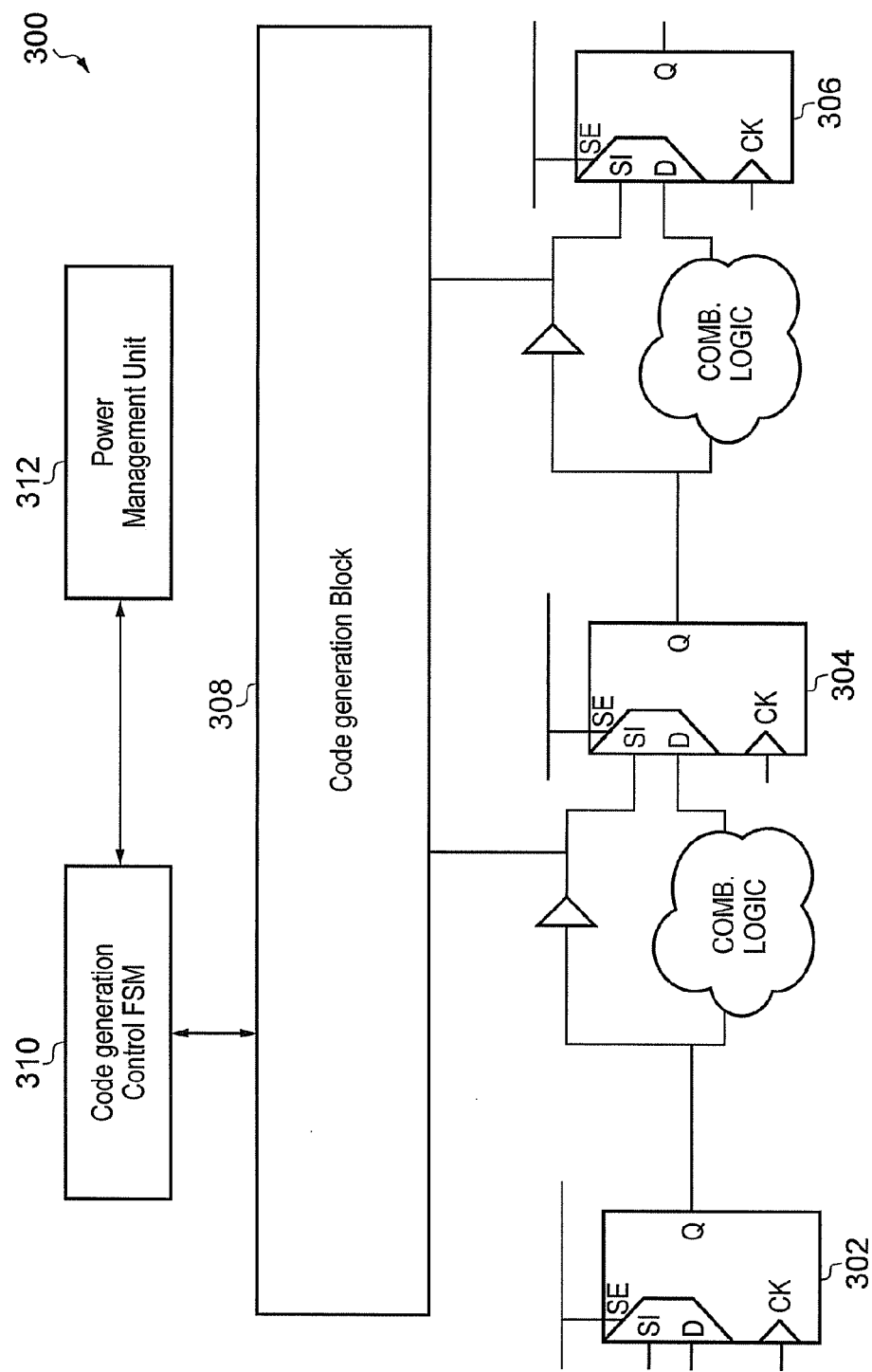
FIG. 8 schematically illustrates the generic configuration of a data processing apparatus in one embodiment.

FIG. 8 schematically illustrates a general example in which the system 300 comprises state retention circuits 302, 304, 306 coupled to combinatorial logic and arranged in a scan chain generally as described above. The scan-in ports SI of the state retention circuits 302, 304, 306 (the scan-flops) are routed to a code generation block 308 that is configured to create a code, where the inputs reflecting the state of the sequential nodes where these inputs are connected can be treated as a message of in bits. For example, where these can come from m scan-flops in the chain whose SI pins are tapped to feed the code generation block. The code that is created can be used to determine the occurrence of any errors when the data processing circuitry is brought out of a data retention mode.

For example, depending on the selected rate of the code generation block, the code generation block 308 is configured to create a code of n bits on entering a data retention mode, which it can later use to check for errors when the data processing circuitry is transitioned from the data retention mode to a standby mode (in preparation for being put into a functional data processing mode). The sequence of operation for this method is as follows:

1) The Power management unit (PMU) 312 puts the data processing circuitry into the standby mode (stops the clock);

2) The PMU 312 instructs the code generation control block 310 (via the code generation control finite state machine 310) to generate and store the code;

3) On generating the code, the code generation control block 310 indicates to the PMU 312 that the code has been generated, the PMU can then trigger the lowering of the voltage to the data processing circuitry;

4) Subsequently, on exiting the data retention mode, the PMU 312 brings up the voltage to the data processing circuitry, but it is still kept in standby (un-clocked) mode;

5) The code generation block 308 then validates the m bits being recieved against the n bit code stored to check for errors (bit flips);

6) Any errors are then flagged to the PMU 312 for further action. If there are no errors, the PMU 312 proceeds to allow the data processing circuitry to return to the functional data processing mode.

A scheme such as the one described above can be designed in a distributed manner to optimize energy consumption and the latency in calculating the code and checking for errors.

Figure 9:
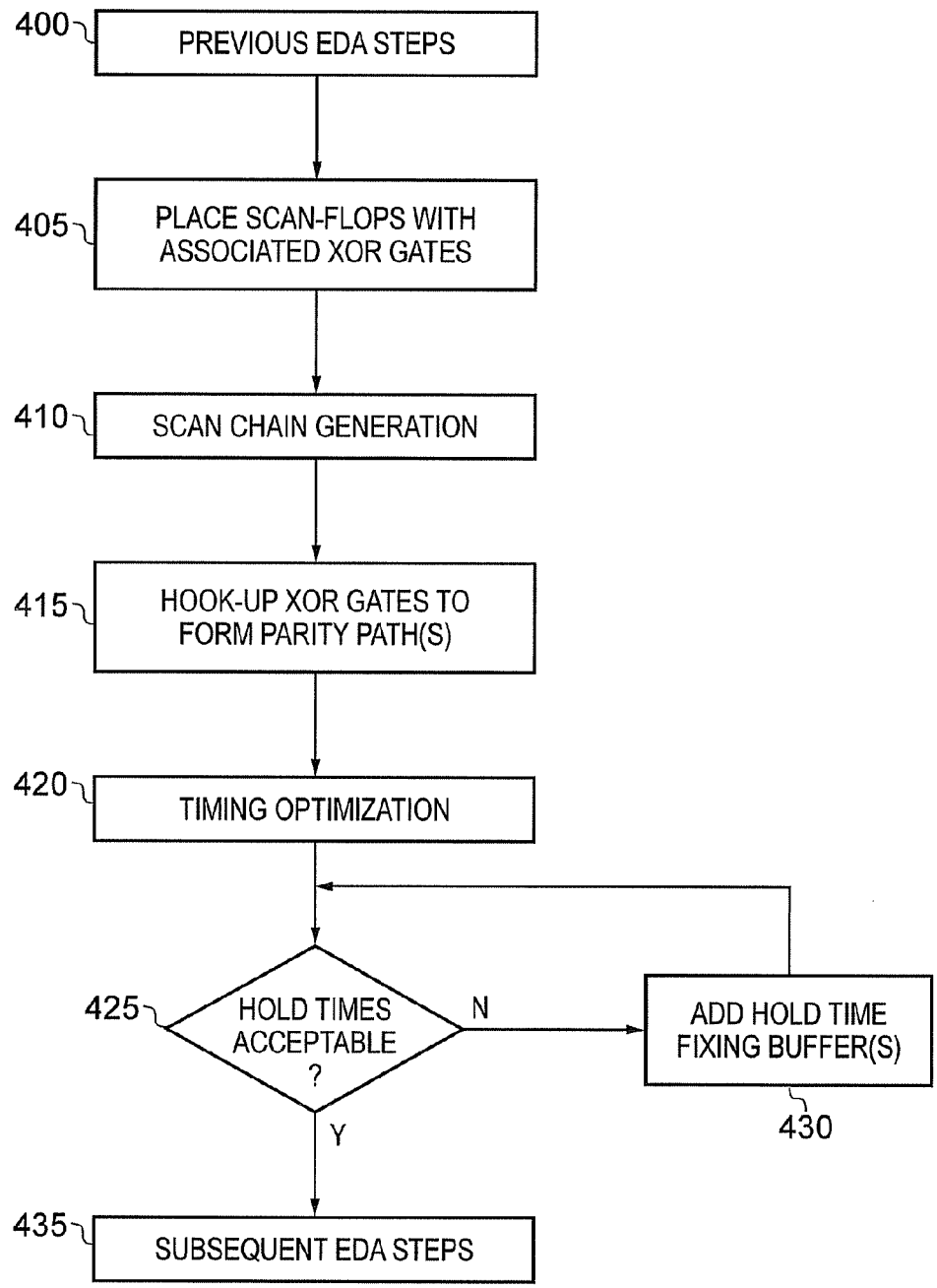
FIG. 9 schematically illustrates a series of steps which may be taken during an electronic design automation process in one embodiment.

As already mentioned above, the implementation of the present technique may form part of an EDA process. FIG. 9 schematically illustrates a series of steps which may be taken by an embodiment when implementing such an EDA process. The flow begins at step 400, illustrating that various other EDA steps will be carried out prior to the implementation of the present technique. Then at step 405, the EDA tool places scan-flops throughout the circuitry under development, each scan-flop being placed with an associated XOR gate. At step 410 the usual scan chain generation steps take place in which the EDA tools hook up the scan-flops into a number of scan chains, the length and number of these multiple chains being balanced according to the system requirements. Then at step 415, the EDA tools can hook up the XOR gates to form one or more parity paths through the circuitry, coupled to the scan-flops. At step 420 a timing optimisation process begins in which it is determined if the hold times within the scan chains are acceptable, in particular whether values provided on a scan chain segment connecting a scan-out port (SO) to a scan-in port (SI) satisfy predetermined timing criteria (step 425). If these hold times are not acceptable then fixing buffers are added to that scan chain portion (step 430) and the flow loops back to check if the hold times are now acceptable. Once the hold times satisfy the required criteria then the EDA process can continue with further standard steps (step 435).

Figure 10:
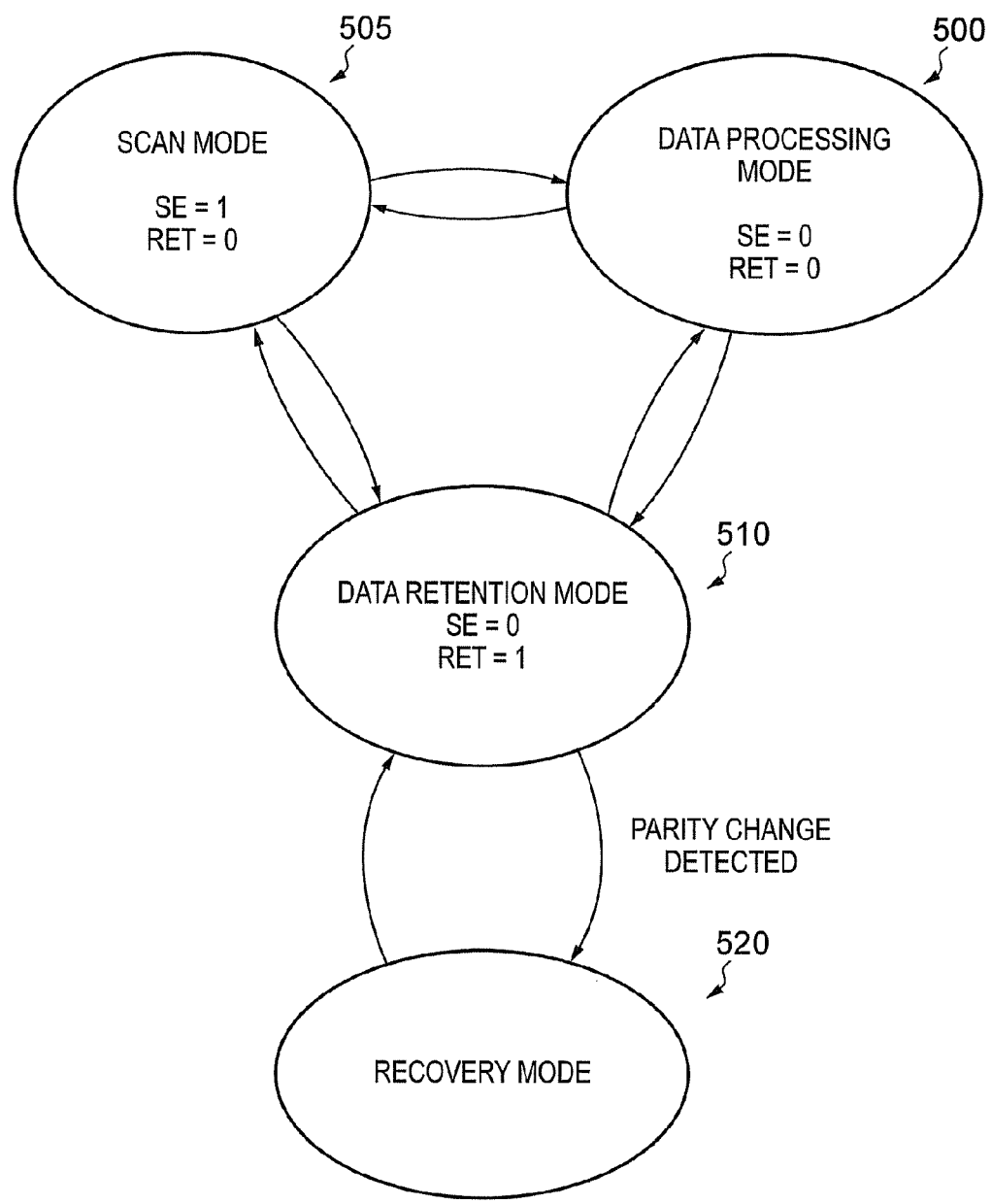
FIG. 10 schematically illustrates various modes and the transitions between those modes for a data processing apparatus in one embodiment.

FIG. 10 is a state diagram illustrating the different modes that the data processing circuitry can exist in and transition between in one embodiment. In this embodiment the state retention circuits are configured in dependence on a scan enable signal SE and a data retention signal RET. When SE=0 and RET=0 the data processing circuitry is in a data processing mode 500. In the data processing mode, the state retention circuits participate in the normal data processing operations of the data processing circuitry, in particular data values being received at their D inputs being propagated via their Q outputs. The state retention circuits may also be configured in a scan mode 505 when SE=1 and RET=0. In this scan mode, the state retention circuits are configured to scan state values into and out of the system via the scan chain of which those state retention circuits form part. In particular, state values received at each SI input are propagated via their SO outputs.

The present technique is in particular represented by a further mode, namely the state retention mode 510, in which each of the state retention circuits can be configured. In the data retention mode SE=0 and RET=1. In this mode, each state retention circuit is configured to hold the state value constant at that particular node of the data processing circuitry, whilst the SO output of each state retention circuit is configured to provide a parity value which reflects the value of the state value being held and the value received at the SI input from the previous state retention circuit in this scan chain. When a parity change is detected (i.e. when a state value within the respective scan chain changes), the system is configured to transition to a recovery mode 520 in which restorative action (as described above) can be taken to repair the state value which has changed, or to perform a reset either of a subset of the data processing circuitry comprising that state retention circuit or even of the entire system. Accordingly the state value which has changed (i.e. became invalid) can either be reset where possible, or could be restored (along with the whole scan chain) to a previous system check point snapshot (e.g. when multiple parity changes present an uncorrectable situation).

Figure 11:
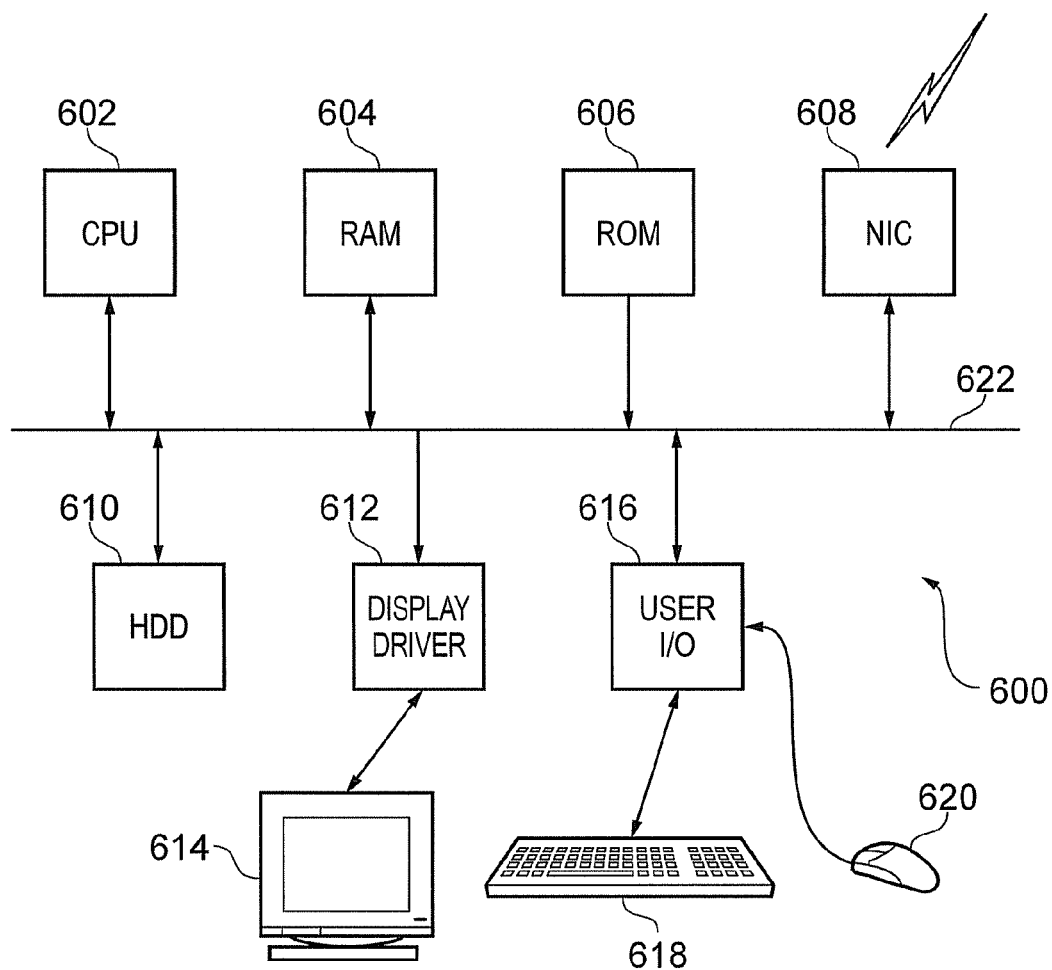
FIG. 11 schematically illustrates a general purpose computing device on which some embodiments may be carried out.

FIG. 11 schematically illustrates a general purpose computing device 600 of the type that may be used to implement the above described automated design processes. The general purpose computing device 600 includes a central processing unit 602, a random access memory 604 and a read only memory 606, connected together via bus 622. It also further comprises a network interface card 608, a hard disk drive 410, a display driver 612 and monitor 614 and a user input/output circuit 616 with a keyboard 618 and mouse 620 all connected via the common bus 622. In operation, such as when the above described techniques form part of an EDA process, the central processing unit 602 will execute computer program instructions that may for example be stored in the random access memory 604 and/or the read only memory 606. Program instructions could be additionally retrieved from the hard disk drive 610 or dynamically downloaded via the network interface card 608. The results of the processing performed may be displayed to a user via a connected display driver 612 and monitor 614. User inputs for controlling the operation of the general purpose computing device 600 may be received via a connected user input output circuit 616 from the keyboard 618 or the mouse 620. It will be appreciated that the computer program could be written in a variety of different computer languages. The computer program may be stored locally on a recording medium or dynamically downloaded to the general purpose computing device 600. When operating under control of an appropriate computer program, the general purpose computing device 600 can perform the above described techniques and can be considered to form an apparatus for performing the above described EDA techniques. The architecture of the general purpose computing device 600 could vary considerably and FIG. 11 is only one example.

Hence in overall summary, according to the present technique a state retention component is provided which is configured to form part of data processing circuitry. The state retention component is configured to hold a state value at a node of the data processing circuitry when the data processing circuitry enters a low power mode. The state retention component comprises a scan input, wherein the state retention component configured, when a scan enable signal is asserted, to read in the state value from a scan input value applied at the scan input, and a scan output, wherein the state retention component is configured, when the scan enable signal is asserted, to read out the state value to the scan output. When the scan enable signal is not asserted, the state retention circuit outputs at the scan output a parity value, wherein the parity value is generated by combinatorial function circuitry on the basis of the state value and the scan input value, wherein the combinatorial function circuitry is configured such that the parity value inverts if either the state value or the scan input value changes, thus providing an external indication of the integrity of the state value held by the state retention component.

Although particular embodiments of the invention have been described herein, it will be apparent that the invention is not limited thereto, and that many modifications and additions may be made within the scope of the invention. For example, various combinations of the features of the following dependent could be made with the features of the independent claims without departing from the scope of the present invention.

I claim:

1. A state retention component configured to form part of data processing circuitry, said state retention component configured to hold a state value at a node of said data processing circuitry when said data processing circuitry enters a low power mode, said state retention component comprising:
    a scan input, said state retention component configured, when a scan enable signal is asserted, to read in said state value from a scan input value applied at said scan input;
    a scan output, said state retention component configured, when said scan enable signal is asserted, to read out said state value to said scan output, wherein said state retention component is configured, when said scan enable signal is not asserted and said data processing circuitry is in said low power mode, to output at said scan output a parity value; and
    combinatorial function circuitry configured to generate said parity value on the basis of said state value and said scan input value, said combinatorial function circuitry configured such that said parity value inverts if either said state value or said scan input value changes, wherein said state retention component is provided with a retention voltage supply, said retention voltage supply configured to provide a sufficient voltage to hold said state value at said node of said data processing circuitry when said data processing circuitry enters said low power mode, wherein said combinatorial function circuitry is powered by said retention voltage supply.

2. The state retention component as claimed in claim 1, wherein said state retention component is a clocked register.

3. The state retention component as claimed in claim 1, wherein said combinatorial function circuitry is provided by XOR circuitry.

4. The state retention component as claimed in claim 1, wherein said combinatorial function circuitry is provided by XNOR circuitry.

5. The state retention component as claimed in claim 1, wherein said combinatorial function circuitry is configured to generate said parity value with odd parity with respect to said state value and said scan input value.

6. The state retention component as claimed in claim 1, wherein said combinatorial function circuitry is configured to generate said parity value with even parity with respect to said state value and said scan input value.

7. The state retention component as claimed in claim 1, wherein said low power mode is a halt mode.

8. The state retention component as claimed in claim 1, wherein said low power mode is a reduced voltage mode.

9. The state retention component as claimed in claim 1, wherein said combinatorial function circuitry is provided with a combinatorial function circuitry voltage supply which is configured to be reduced when said data processing circuitry is not in said low power mode.

10. The state retention component as claimed in claim 1, wherein said combinatorial function circuitry is configured to be power-gated off when said data processing circuitry is not in said low power mode.

11. The state retention component as claimed in claim 1, wherein said state retention component is configured to be responsive to a retention signal to enter a state retention mode, and said combinatorial function circuitry is configured to be enabled in response to said retention signal.

12. The state retention component as claimed in claim 11, wherein said state retention component is configured to be responsive to de-assertion of said retention signal to exit said state retention mode, and said combinatorial function circuitry is configured to be disabled in response to de-assertion of said retention signal.

13. The state retention component as claimed in claim 1, further comprising a parity input and a parity output,
wherein said state retention component is configured, when said scan enable signal is not asserted, to output at said parity output a further parity value,
wherein said further parity value is generated by further combinatorial function circuitry on the basis of said state value and a value at said parity input, said further combinatorial function circuitry configured such that said further parity value inverts if either said state value or said value at said parity input changes.

14. A computer program product storing in a non-transient fashion a computer program, which when executed on a computing device causes the computing device to generate a representation of the apparatus according to claim 1.

15. A state retention component configured to form part of data processing circuitry, said state retention component configured to hold a state value at a node of said data processing circuitry when said data processing circuitry enters a low power mode, said state retention component comprising:
scan input means for reading in, when a scan enable signal is asserted, said state value from a scan input value applied to said scan input means;
scan output means for reading out, when said scan enable signal is asserted, said state value, wherein said state retention component is configured, when said scan enable signal is not asserted and said data processing circuitry is in said low power mode, to output at said scan output means a parity value; and
combinatorial function means for generating said parity value on the basis of said state value and said scan input value, said combinatorial function means configured such that said parity value inverts if either said state value or said scan input value changes, wherein said state retention component is provided with a retention voltage supply means for providing a sufficient voltage to hold said state value at said node of said data processing circuitry when said data processing circuitry enters said low power mode, wherein said combinatorial function means is powered by said retention voltage supply means.

16. A method of configuring a state retention component to form part of data processing circuitry, said state retention component configured to hold a state value at a node of said data processing circuitry when said data processing circuitry enters a low power mode, said method comprising the steps of:
providing a scan input for said state retention component and configuring said state retention component, when a scan enable signal is asserted, to read in said state value from a scan input value applied at said scan input; and
providing a scan output for said state retention component and configuring said state retention component, when said scan enable signal is asserted, to read out said state value to said scan output;
configuring said state retention component, when said scan enable signal is not asserted and said data processing circuitry is in said low power mode, to output at said scan output a parity value, wherein said parity value is generated by a combinatorial function on the basis of said state value and said scan input value, said combinatorial function configured such that said parity value inverts if either said state value or said scan input value changes; and
providing said state retention component with a retention voltage supply having a sufficient voltage to hold said state value at said node of said data processing circuitry when said data processing circuitry enters said low power mode, wherein said combinatorial function is powered by said retention voltage supply.

17. A computer program product storing in a non-transient fashion a computer program, which when executed on a computing device causes the computing device to carry out the method according to claim 16.

* * * * *